United States Patent
Montross

(10) Patent No.: US 10,377,631 B1
(45) Date of Patent: Aug. 13, 2019

(54) CATALYST SOLVENTS FOR CARBON NITRIDE

(71) Applicant: Charles Montross, Portland, OR (US)

(72) Inventor: Charles Montross, Portland, OR (US)

( * ) Notice: Subject to any disclaimer, the term of this patent is extended or adjusted under 35 U.S.C. 154(b) by 0 days.

(21) Appl. No.: 15/962,869

(22) Filed: Apr. 25, 2018

(51) Int. Cl.
| | |
|---|---|
| *C01B 21/06* | (2006.01) |
| *B01J 27/24* | (2006.01) |
| *B01J 35/02* | (2006.01) |
| *C30B 9/10* | (2006.01) |
| *C30B 29/38* | (2006.01) |
| *C30B 35/00* | (2006.01) |

(52) U.S. Cl.
CPC ........... *C01B 21/0605* (2013.01); *B01J 27/24* (2013.01); *B01J 35/02* (2013.01); *C30B 9/10* (2013.01); *C30B 29/38* (2013.01); *C30B 35/007* (2013.01); *B01J 2523/22* (2013.01); *B01J 2523/23* (2013.01); *B01J 2523/27* (2013.01); *B01J 2523/28* (2013.01); *B01J 2523/40* (2013.01); *C01P 2002/30* (2013.01)

(58) Field of Classification Search
None
See application file for complete search history.

(56) References Cited

U.S. PATENT DOCUMENTS

2007/0254206 A1* 11/2007 Gillan ............... H01M 4/90
429/494
2014/0050650 A1* 2/2014 Sawamura .......... C30B 29/38
423/384

* cited by examiner

*Primary Examiner* — Guinever S Gregorio
(74) *Attorney, Agent, or Firm* — Mohr Intellectual Property Law Solutions, PC

(57) ABSTRACT

In one embodiment, a method of producing an sp3 bonded $C_3N_4$ product includes contacting a starting material with a catalyst solvent in a reaction vessel, heating the reaction vessel to a temperature of 900° to 2000° C. under a pressure of 4 to 8 GPa, melting at least some of the catalyst solvent, and transforming at least some of the sp2 bonded $C_3N_4$ into sp3 hybridized $C_3N_4$. The starting material may include sp2 bonded $C_3N_4$. The catalyst solvent may be a solid at room temperature. In one example, the catalyst solvent is a carbo-nitride based catalyst solvent including a first compound having the chemical formula $A_xB_yN_z$ and a second compound having the chemical formula $D_qE_rC_s$. In a second example, the catalyst solvent is a metal alloy based catalyst solvent including a compound having the chemical formula $G_xH_y$.

19 Claims, No Drawings

CATALYST SOLVENTS FOR CARBON NITRIDE

BACKGROUND

The present invention relates to a class of catalyst solvents and their use to transform sp2 bonded $C_3N_4$, such as graphitic or amorphous carbon nitride, into sp3 bonded $C_3N_4$, such as cubic or spinel $C_3N_4$, when processed at temperature and pressure conditions lying within the thermodynamically stable, sp3 bonding region for $C_3N_4$. The present invention also relates to products made with this class of catalyst solvents, such as a polycrystalline compact of sp3 bonded $C_3N_4$ grains formed with sp3 bonding between said crystals.

THE PRIOR ART

Superabrasives, such as diamond, became an important part of modern industry with the development of synthetic diamond in the late 1950's (see, e.g., U.S. Pat. Nos. 2,947,611, 2,947,608, 2,947,610, and 2,947,609). Polycrystalline diamond, suitable for tools and the like, was made from the bonding of diamond crystals with the use of catalyst solvents at temperatures and pressures where diamond is thermodynamically stable (see, e.g., U.S. Pat. Nos. 3,141,746 and 3,702,573). To avoid the required high pressures, diamond compacts were made where the diamond grains are brazed together with a reactive braze (see, e.g., U.S. Pat. No. 3,293,012). Diamond compacts were also made by infiltration with molten silicon or silicon based alloys to form by reaction with the diamond a SiC bond between the diamond grains (see, e.g., U.S. Pat. No. 4,220,455).

Cohen identified in 1985 a potential superabrasive known as cubic carbon nitride, $C_3N_4$, with a diamond or zinc blende cubic crystal structure that has the potential for bulk moduli as high as diamond, if not higher (Cohen M L. Calculation of bulk moduli of diamond and zinc-blende solids. *Physical Review B* 1985; 32. DOI: 10.1103/PhysRevB.32.7988). Teter et al. defined cubic $C_3N_4$ based on the calculated zero pressure bulk modulus being greater than the experimentally measured bulk modulus for diamond and based on the corresponding crystal structure and predicted band gap and atomic densities. (U.S. Pat. No. 5,981,094 to Teter et al.).

Malkow, in his review of $C_3N_4$ materials, identified common methods for determining sp2 bonded from sp3 bonded $C_3N_4$, such as electron recoil detection analysis (ERDA), Fourier Transform infrared (FTIR), electron energy loss spectroscopy (EELS), nuclear magnetic resonance (NMR), x-ray photoelectron spectroscopy (XPS), Raman spectroscopy, and x-ray absorption near edge spectroscopy (XANES) (Malkow T. Critical observations in the research of carbon nitride. *Materials Science and Engineering A* 2000; 292: 13. DOI: S0921-5093(00)00960-6). He noted that diffraction patterns alone are not suitable to identify carbon nitride phases, especially nanocrystalline phases. Since both carbon and nitrogen are neighboring, low atomic number elements, elemental analyses by x-ray fluorescence (XRF) and energy dispersive analysis (EDAX) would be difficult to provide more than crude approximations. The majority of these methods required extensive sample preparation, especially EELS, XPS, and XANES.

Experience with the thermal degradation of diamond has found that laser Raman spectroscopy to be the easiest and most sensitive method for detecting the sp2 bonding peak 1580 cm-1 and sp3 bonding peak 1350 cm-1 for diamond (Westraadt J E. *Thermal Degradation of Diamond Compacts: A TEM Investigation.* Research, Nelson Mandela Metropolitan University, South Africa, 2011). Multiwavelength Raman allows a direct correlation of the Raman parameters with N content and UV Raman allows the sp3 content to be quantified in cubic $C_3N_4$ (Ferrari A C, Rodil S E and Robertson J. Interpretation of infrared and Raman spectra of amorphous carbon nitrides. *Physical Review B* 2003; 67: 20. DOI: 10.1103/PhysRevB.67.155306 and Widany J, Weich F, Hohler T, et al. Dynamic properties and structure formation of boron and carbon nitrides *Diamond and Related Materials* 1996; 5: 11.)

Wixom tried to use shock wave synthesis on organic carbon nitride precursors to synthesize cubic or zinc blende $C_3N_4$ but was unsuccessful (Wixom M R. Chemical Preparation and Shock Wave Compression of Carbon Nitride Precursors. *Journal of the American Ceramic Society* 1990; 73: 6. DOI: 10.1111/j.1151-2916.1990.tb05254.x). Haller et al. tried a different tact using a sputtering type process achieving some sp3 type bonding in the carbon nitride produced (U.S. Pat. No. 5,110,679 to Haller et al.). Niu et al. used pulsed laser ablation with nitrogen gas to produce a carbon nitride material with properties similar to those predicted for sp3 bonded, cubic $C_3N_4$ (Niu C, Lu Y Z and Lieber C M. Experimental Realization of the Covalent Solid Carbon Nitride. *Science,* 1993; 261: 4. DOI: 10.1126/science.261.5119.334). Lieber et al. furthered the pulsed laser ablation technique with a high flux atomic beam, finding crystallites of what Lieber called $\beta$-$C_3N_4$ in the produced film (Lieber C M and Zhang Z J. Synthesis of Covalent Carbon—Nitride Solids: Alternatives to Diamond? *Advanced Materials* 1994; 6: 3. DOI: 10.1002/adma.19940060614). Leiber states "although $\beta$-$C_3N_4$, has been predicted to have a hardness comparable to or greater than diamond, it cannot be produced by traditional solid-state chemistry methods." Similar results were found by Riviere et al. (Riviere J P, Texier D, Delafond J, et al. Formation of the crystalline $\beta$-$C_3N_4$ phase by dual ion beam sputtering deposition *Materials Letters* 1995; 22: 4. DOI: unk). As reviewed by DeVries in the mid 1990's, the materials produced were considered woefully deficient in nitrogen and non-stoichiometric (DeVries R C. $C_3N_4$ or Bust. *Diamond and Related Materials* 1995; 4: 2. DOI: unk). Nitrogen was identified by Malkow as being critical to get all sp3 bonding which is necessary for achieving the desired properties.

Nguyen et al found that in a laser heated diamond anvil cell, with high pressure (30 GPa) and high temperatures (2000°+K), sp2 bonded, graphitic $C_3N_4$ was converted into sp3 bonded, cubic $C_3N_4$ based on x-ray diffraction analyses (Nguyen J H and Jeanloz R. Initial description of a new carbon-nitride phase synthesized at high pressures and temperatures. *Materials Science and Engineering A* 1996; 209: 3. DOI: unk). Stevens et al. was not successful with their high pressure high temperature apparatus, finding that the sp2 bonded, graphitic $C_3N_4$ decomposed and only produced diamond (Stevens A J, Koga T, Agee C B, et al. Stability of Carbon Nitride Materials at High Pressure and Temperature *Journal of American Chemical Society* 1996; 118: 2. DOI: unk).

Reviewing the state of the art, Yacaman concludes "that there is not enough evidence that $C_3N_4$ can be produced as large crystals" (Yacaman M J, Martin-Gil J, Martin-Gil F, et al. New carbon-nitrogen materials. A likely alternative to diamond *Materials Chemistry and Physics* 1997; 47: 9. DOI: IS0254-0584(96)01782-1). Yet Han et al. found a phase transition to sp3 bonded, cubic $C_3N_4$ using a diamond anvil cell (Han Y H, Luo J F, Gao C X, et al. Phase Transition of Graphitic $C_3N_4$ under High Pressure by In Situ Resistance Measurement in a Diamond Anvil Cell. *Chinese Physics Letters* 2005; 22: 3. DOI: unk).

Despite conflicting results from ab initio calculations regarding the predicted hardnesses, $C_3N_4$ in a cubic or spinel type crystal structure is considered by Sung to be more thermally stable than diamond (Sung C-M and Sung M. Carbon nitride and other speculative superhard materials. *Materials Chemistry and Physics* 1996; 43: 18. DOI: 0254-0584(95)01607-V). Teter et al. note from their calculations for the sp2 bonded, graphitic $C_3N_4$ transformation to sp3 bonded, cubic $C_3N_4$ that it is within the reach of modern, large volume, high pressure presses for industrial scale production (Teter D M and Hemley R J. Low Compressibility Carbon Nitrides. *Science* 1996; 271: 3. DOI: 10.1126/science.271.5245.53).

This identified thermal stability and potential ease of manufacture makes sp3 bonded cubic $C_3N_4$ ideal for industrial superabrasive applications providing an impetus to develop a process to make bulk sp3 bonded $C_3N_4$. Therefore, a process that uses a catalyst solvent to transform graphitic sp2 bonded carbon nitride into bulk (cubic and/or spinel) sp3 bonded $C_3N_4$ would be of great value to industry.

Specific examples of catalyst solvents configured to transform sp2 bonded carbon nitride into sp3 bonded $C_3N_4$, addressing the needs identified above, are disclosed below. The complete disclosures of the above references, patents and patent applications are herein incorporated by reference for all purposes.

SUMMARY

The present disclosure is directed to catalyst solvents and methods of using the same to produce a sp3 bonded $C_3N_4$ product. In one embodiment, a method of producing an sp3 bonded $C_3N_4$ product includes contacting a starting material with a catalyst solvent in a reaction vessel, heating the reaction vessel to a temperature of 900° to 2000° C. under a pressure of 4 to 8 GPa, melting at least some of the catalyst solvent, and transforming at least some of the sp2 bonded $C_3N_4$ into sp3 hybridized $C_3N_4$. The starting material may include sp2 bonded $C_3N_4$. The catalyst solvent may be a solid at room temperature.

In one example, the catalyst solvent is a carbo-nitride based catalyst solvent including a first compound having the chemical formula $A_xB_yN_z$ and a second compound having the chemical formula $D_qE_rC_s$. D may be selected from the group consisting of the transition metals, lanthanide metals and Ca. E may be selected from the group consisting of the Group IIIB metalloid elements, the Group IVB metalloid elements, Mg, Zn, and Cd. C is carbon In a second example, the catalyst solvent is a metal alloy based catalyst solvent including a compound having the chemical formula $G_xH_y$. G may be selected from the group consisting of the transition metals, lanthanide metals and Ca. H may be selected from the group consisting of the Group IIIB metalloid elements, the Group IVB metalloid elements, Mg, Zn, and Cd.

DETAILED DESCRIPTION

The disclosed so will become better understood through review of the following detailed description. The detailed description provides merely examples of the various inventions described herein. Those skilled in the art will understand that the disclosed examples may be varied, modified, and altered without departing from the scope of the inventions described herein. Many variations are contemplated for different applications and design considerations; however, for the sake of brevity, each and every contemplated variation is not individually described in the following detailed description.

Throughout the following detailed description, examples of various catalyst solvents are provided. Related features in the examples may be identical, similar, or dissimilar in different examples. For the sake of brevity, related features will not be redundantly explained in each example. Instead, the use of related feature names will cue the reader that the feature with a related feature name may be similar to the related feature in an example explained previously. Features specific to a given example will be described in that particular example. The reader should understand that a given feature need not be the same or similar to the specific portrayal of a related feature in any given FIGURE or example.

As used herein, sp3 hybridized $C_3N_4$, also known as sp3 bonded $C_3N_4$, means a carbon nitride having the chemical formula $C_3N_4$ wherein the one s and three p orbitals of each constituent element are intermixed to form four identical hybrid sp3 orbitals. Sp3 hybridization is also known as tetrahedral hybridization. Examples of sp3 hybridized $C_3N_4$ include cubic $C_3N_4$ and spinel $C_3N_4$.

As used herein, a gradient layer is layer between a polycrystalline C3N4 compact and a substrate in which the average thermal expansion coefficient varies from that of the compact at one edge of the gradient layer to that of the substrate at the other edge. The purpose of the changing of the average thermal expansion coefficient between the sp3 bonded $C_3N_4$ compact and the substrate is to reduce stresses due to differences in thermal expansion coefficients.

As used herein, polycrystalline sp3 bonded $C_3N_4$ is sp3 bonded $C_3N_4$ grit that has been bonded under high-pressure, high-temperature conditions. Polycrystalline sp3 bonded $C_3N_4$ consists of synthetic sp3 bonded $C_3N_4$ powders bonded together by sintering at high pressures and temperatures. This bonding results in sp3 bonding between the particles or grit of sp3 bonded $C_3N_4$.

Surprisingly, the inventor has found that a mixture of molten transition metals with transition metal nitrides acts as a very effective catalyst solvent to convert sp2 bonded $C_3N_4$ into a sp3 bonded $C_3N_4$ material. This was unexpected as transition metal nitrides are not generally wetted nor readily dissolved by molten transition metals consisting of group VIIIA of the periodic table. Further, even if a hypothetical molten transition metal did wet and react with sp2 bonded $C_3N_4$, it would be expected to react to form nitrides and carbides. Nevertheless, the inventor has found that the catalyst solvents described below do, in-fact, wet sp2 bonded $C_3N_4$ material and, under the right conditions, transform it to sp3 bonded $C_3N_4$ material.

Additionally, it would not be expected that the use of only transition metal nitrides would successfully act as a catalyst solvent to convert graphite to diamond. Thus it would not be expected that such transition metal nitrides would act as catalyst solvents to convert sp2 bonded $C_3N_4$ into a sp3 bonded $C_3N_4$ material. Indeed, a search of the literature has identified no mention of the diamond catalyst solvents such as iron, nickel, cobalt, or manganese being successfully used with making sp3 bonded $C_3N_4$.

Despite the theoretical improbability described above, the inventor has discovered that ternary metal carbides when mixed with ternary metal nitrides function as catalyst solvents that transform sp2 bonded graphitic $C_3N_4$ into sp3 bonded cubic $C_3N_4$. These ternary metal carbides and ternary metal nitrides are also known as anti-perovskites or inverse perovskites. Ternary metal carbides and ternary metal nitrides are described as stoichiometric compounds with the formula of $M_3M'D$, where the approximate ratio of M to M' to D is 3:1:1.

The element M is defined to be a transition metal belonging to following group of elements (Group IIIA [Sc, Y, La], Group IVA [Ti, Zr, Hf], Group VA [V, Nb, Ta], Group VIA [Cr], Group VIIA [Mn], Group VIIIA [Fe, Co, Ni, Pd, Pt] or Lanthanides [Ce]). The alkali earth metal Ca has also been found to form a ternary metal carbide structure.

In the ternary metal carbide or nitride structure, element M' has been found to belong to the group of metalloid elements from Group IIIB (B, Al, Ga, In) and Group IVB (Si, Ge, Sn, Pb) along with the elements Mg, Zn and Cd. The element D in the ternary metal compound structure can be either C or N.

Due to the close crystallographic similarity between all the ternary metal carbides and nitrides discussed in the literature, solid solutions can and do form with unpredictable results. The element D in the ternary metal compound structure of the example $Fe_3SnD$ can be a solid solution of C and N, forming $Fe_3Sn(C, N)$. And the stoichiometry of element D has been found in practice to vary and to not be strictly 1 with respect to the M and M' elements without affecting its catalyst solvent abilities. Similarly, the ternary metal compound $Mn_3GeC$ can form a solid solution with $Fe_3GeC$. The ternary metal compound $Fe_3GeC$ can form a solid solution with $Fe_3SnC$. Because of the metalloid element M', the ternary metal carbides and nitrides melt at temperatures far lower than the melting/decomposition temperatures of simple metal carbides or metal nitrides. This is industrially convenient for their use as catalyst solvents with $C_3N_4$.

The mechanism for the catalyst solvent transformation of sp2 bonded $C_3N_4$ to sp3 bonded $C_3N_4$ is not known. It is hypothesized that, and by no means limited to, the metalloid element M' forms the liquid when the ternary metal carbide/nitride melts and prevents the formation of insoluble metal carbides and nitrides due to the chemical interaction with the transition metal carbides and nitrides. The liquid consisting of the metalloid element M' with dissolved transition metal M is able to interact and react with the sp2 bonded $C_3N_4$ and transform it into sp3 bonded $C_3N_4$ when the system is at pressures where the sp3 bonded $C_3N_4$ is thermodynamically stable.

Under high pressures and temperatures which are used in diamond synthesis, it is not known how the molten, group VIIIA transition metals react with the graphite material. One possible explanation is the carbon atoms are dissolved individually into the molten metal while others hypothesize that clusters of carbon atoms detach from the graphite into the molten metal, to then be deposited on the diamond crystal's surface.

Non-diamond carbon or carbonaceous materials with sp2 bonding are converted into diamond carbon with sp3 bonding using a catalyst solvent at temperatures and pressures where diamond is thermodynamically stable. The pressure—temperature range for synthesis of sp3 bonded $C_3N_4$ is in the region above the line formed from approximately a minimum of 5 GPa at 1000° C. to a minimum of 7 GPa for a temperature of 1800° C. For a typical industrial pressure of 6 GPa, the useable temperature range of catalyst solvents is from approximately 1000° C. to a maximum of 1500° C., at which such temperature approaches the sp2 bonded $C_3N_4$ region. Below 1000° C., the catalyst solvents are generally not molten and therefore unable to convert the sp2 bonded $C_3N_4$ material into sp3 bonded $C_3N_4$.

In one embodiment, the catalyst solvent comprises Group VIIIA metals such as Mn, Fe, Co, and Ni with additions of carbide formers such as Cr and Ta and alloys thereof.

In one embodiment, a method of producing an sp3 bonded $C_3N_4$ product includes contacting a starting material with a catalyst solvent in a reaction vessel, heating the reaction vessel to a temperature of 900° to 2000° C. under a pressure of 4 to 8 GPa, melting at least some of the catalyst solvent, and transforming at least some of the sp2 bonded $C_3N_4$ into sp3 hybridized $C_3N_4$. The starting material may include sp2 bonded $C_3N_4$. The catalyst solvent may be a solid at room temperature.

In one example, the catalyst solvent is a carbo-nitride based catalyst solvent including a first compound having the chemical formula $A_xB_yN_z$ and a second compound having the chemical formula $D_qE_rC_s$. A may be selected from the group consisting of the transition metals, lanthanide metals and Ca. B may be selected from the group consisting of the Group IIIB metalloid elements, the Group IVB metalloid elements, Mg, Zn, and Cd. N is nitrogen. x may be from 2.5 to 3.5, y may be from 0.5 to 1.5, and z may be from 0.5 to 1.5. D may be selected from the group consisting of the transition metals, lanthanide metals and Ca. E may be selected from the group consisting of the Group IIIB metalloid elements, the Group IVB metalloid elements, Mg, Zn, and Cd. C is carbon. q may be from 2.5 to 3.5, r is from 0.5 to 1.5, and s is from 0.5 to 1.5. The stoichiometric ratio of the number of moles of carbon of the second compound to the number of moles of nitrogen of the first compound in the catalyst solvent may be from 2.5:4 to 3.9:4.

In one embodiment, x in the chemical formula $A_xB_yN_z$ is 3, y is 1 and z is 1. In one embodiment, q in the chemical formula $D_qE_rC_s$ is 3, r is 1 and s is 1.

In another embodiment, the catalyst solvent is a metal alloy based catalyst solvent including a compound having the chemical formula $G_xH_y$. G may be selected from the group consisting of the transition metals, lanthanide metals and Ca. H may be selected from the group consisting of the Group IIIB metalloid elements, the Group IVB metalloid elements, Mg, Zn, and Cd.

The subscript x in the chemical formula $G_xH_y$ may range from 2 to 4. In one embodiment, x is from 2.5 to 3.5. In one embodiment, x is 3. The subscript y in the chemical formula $G_xH_y$ may range from 0.2 to 2. In one embodiment, y may range from 0.5 to 1.5. In one embodiment, y is 1.

In one embodiment, the method includes seeding the reaction vessel with grains of crystal seed material. In one example, the crystal seed material may comprise diamond. In one embodiment, the crystal seed material comprises sp3 bonded $C_3N_4$. The method may include the step of growing a first single crystal via deposition of sp3 bonded $C_3N_4$ onto the surface of a single grain of crystal seed material.

In one embodiment, the sp3 bonded $C_3N_4$ material obtained via the methods above may be incorporated into a polycrystalline compact. The polycrystalline compact may be produced via a catalyst solvent. The catalyst solvent used to produce the polycrystalline compact may be the same as the catalyst solvent or it may be a different catalyst solvent. In one embodiment, the sp3 bonded $C_3N_4$ material is produced via a first catalyst solvent system, and the polycrystalline compact is produced via a second catalyst solvent system. In another embodiment, the sp3 bonded $C_3N_4$ material and the polycrystalline compact is produced via a the same catalyst solvent system.

In one embodiment, producing the polycrystalline compact may include processing at least some of the sp3 bonded $C_3N_4$ into a powder. The powder may be loaded into a reaction vessel. This may be the same reaction vessel used to produce the sp3 bonded $C_3N_4$ material or it may be a different reaction vessel. A layer of solid material comprising a catalyst solvent may be arranged in the reaction vessel. The second reaction vessel may be heated to a temperature of 900 to 2000 degrees C. under a pressure of 4 to 8 GPa, thereby melting at least some of the catalyst solvent and infiltrating the powdered sp3 bonded $C_3N_4$ with the melted catalyst solvent. Finally, the reaction vessel may be cooled to produce a sintered polycrystalline compact comprising sp3 bonded $C_3N_4$.

In another embodiment, producing the polycrystalline compact may include processing at least some of the sp3 bonded $C_3N_4$ into a powder then mixing the powder with a catalyst solvent to create a solid mixture. (i.e., the catalyst solvent may be a solid at room temperature). The mixture may be loaded into a reaction vessel. The reaction vessel may be heated to a temperature of 900 to 2000 degrees C. under a pressure of 4 to 8 GPa, thereby melting at least some of the catalyst solvent. The reaction vessel may then be cooled to produce a sintered polycrystalline compact comprising sp3 bonded $C_3N_4$.

In one embodiment, the method may include creating pores in the sintered polycrystalline compact by removing the majority of the second catalyst solvent from the sintered polycrystalline compact. The pores may be used to facilitate bonding the sintered polycrystalline compact to a substrate, wherein the bonding occurs at a temperature of 900 to 2000 degrees C. under a pressure of 4 to 8 GPa. In one embodiment, the substrate binder phase has a melting temperature and wherein the second catalyst solvent has a melting temperature below the melting temperature of the substrate binder phase.

The porous sintered polycrystalline compact may be bonded to a substrate by melting the binder phase of the substrate into the pores. Prior to the bonding step, creating a gradient layer on the surface of the substrate may be advantageous. In one embodiment, the gradient layer is a mixture of sp3 bonded $C_3N_4$ particles with particles of the substrate and second catalyst solvent to result in a sintered polycrystalline compact with a thermal expansion coefficient between the body (or bulk) of sp3 bonded $C_3N_4$ sintered polycrystalline compact and the thermal expansion coefficient for the body (or bulk) of the substrate. The purpose of the changing of the average thermal expansion coefficient between sp3 bonded $C_3N_4$ compact and the substrate is to reduce stresses due to differences in thermal expansion coefficients. Prior to the bonding step, creating a roughened texture on the surface of the metallic substrate may also prove advantageous.

In one embodiment, the catalyst solvent used to produce the sintered polycrystalline compact comprises $Co_3SnC$ and $Co_3SnN$.

Example 1. $Fe_3Sn(C,N)$

A mixture of Fe and Sn metal powders in the correct atomic ratio of 3:1 was prepared, mixed with sp2 bonded carbon nitride material, and reacted at ambient pressures under an inert atmosphere at 1000° C., and formed $Fe_3Sn(C,N)$ along with unreacted sp2 bonded carbon nitride material. This reacted mixture will produce sp3 bonded polytypes of $C_3N_4$ from the unreacted sp2 bonded carbon nitride material and $Fe_3Sn(C,N)$, when pressurized and heated to pressures and temperatures where sp3 bonded polytypes of $C_3N_4$ are thermodynamically stable, from a minimum pressure of approximately 5 GPa at 1000° C. to a minimum pressure of approximately 7 GPa for a temperature of 1800° C.

Example 2. $Co_3InC+Ce_3InN$

A mixture of $Co_3InC$ and $Ce_3InN$ powders in the correct mole ratio of 3:4 was prepared and mixed with sp2 bonded carbon nitride material. This mixture will produce sp3 bonded polytypes of $C_3N_4$ from the sp2 bonded carbon nitride material, when pressurized and heated to pressures and temperatures where sp3 bonded polytypes of $C_3N_4$ are thermodynamically stable, from a minimum pressure of approximately 5 GPa at 1000° C. to a minimum pressure of approximately 7 GPa for a temperature of 1800° C.

Example 3. $Fe_3SnC+Mn_3GeN$

A mixture of $Fe_3SnC$ and $Mn_3GeN$ powders in the correct mole ratio of 3:4 was prepared and mixed with sp2 bonded carbon nitride material. This mixture will produce sp3 bonded polytypes of $C_3N_4$ from the sp2 bonded carbon nitride material, when pressurized and heated to pressures and temperatures where sp3 bonded polytypes of $C_3N_4$ are thermodynamically stable, from a minimum pressure of approximately 5 GPa at 1000° C. to a minimum pressure of approximately 7 GPa for a temperature of 1800° C.

Example 4. $3Fe+Sn+C_3N_4$

A mixture of Fe and Sn metal powders in the correct atomic ratio of 3:1 was prepared, mixed with sp2 and or sp3 bonded carbon nitride material, and reacted at high pressures and temperatures where sp3 bonded polytypes of $C_3N_4$ are thermodynamically stable, from a minimum pressure of approximately 5 GPa at 1000° C. to a minimum pressure of approximately 7 GPa for a temperature of 1800° C. This reacted mixture will produce sp3 bonded polytypes of $C_3N_4$ from the unreacted sp2 bonded carbon nitride material and $Fe_3Sn(C,N)$.

Example 5. Compact of sp3 Bonded $C_3N_4$ and Cu+Ti Braze Alloy

A compact of sp3 bonded $C_3N_4$ with a Cu+Ti braze alloy is made by putting sp3 bonded $C_3N_4$ grit into a graphite mold that has been coated with hexagonal boron nitride. A powder mixture of copper metal powder and 15 weight % Ti metal powder is placed on top of the sp3 bonded $C_3N_4$ grit. The 15 weight % titanium is needed because of the surface area of the sp3 bonded grit that needs to be wetted by the molten copper. The mold with the sp3 bonded $C_3N_4$ grit and Cu+Ti metal powders is placed in a vacuum furnace and evacuated to outgas these components. The vacuum furnace is heated at 200 C/hour to 300 C at which point a 10 Pa Argon atmosphere is introduced to provide an overpressure and prevent excessive metal evaporation in the vacuum furnace. The vacuum furnace is further heated at 200 C/hour to 1120 C and held for 1 hour at this temperature. The vacuum furnace is then cooled to room temperature, pressurized to atmosphere and then opened. The compact of sp3 bonded $C_3N_4$ grit with copper is then removed from the vacuum furnace and the graphite mold and cleaned.

Example 6. Compact of sp3 Bonded $C_3N_4$ with SiC and $Si_3N_4$ Bonding Phase A compact of sp3 bonded $C_3N_4$ with SiC and $Si_3N_4$ bonding phase is made by first pressing a compact of sp3 bonded $C_3N_4$ grains or particles with the fugitive binder poly propylene carbonate with propylene carbonate added as a plasticizer. A compact of silicon metal powder mixed with 15 weight % titanium metal powder is pressed with the fugitive binder poly propylene carbonate with propylene carbonate added as a plasticizer. The compact of silicon and titanium metal powder is placed on the graphite plate coated with hexagonal boron carbide and then the compact of sp3 bonded $C_3N_4$ grains or particles is placed on top. The graphite plate with two compacts is placed in a vacuum furnace and the vacuum furnace is evacuated to $10^{-6}$ atmospheres pressure and slowly heated at 50 C/hour to 300 C to remove the fugitive binder. The vacuum furnace is then heated to 1300 C at 200 C/hour then held at temperature for 1 hour. The silicon-titanium metal compact has a eutectic temperature of 1330 C. After reaching temperature equilibrium, the vacuum furnace temperature is then stepped to 1500 C and held at that temperature for 1 hour, then cooled to room temperature and the compact of sp3 bonded $C_3N_4$ with SiC and $Si_3N_4$ bonding phase is removed from the graphite plate. The reaction of the $C_3N_4$+6 Si yields $Si_3N_4$+3 SiC. There is some solubility of $Si_3N_4$ in the SiC resulting in electrically conductive SiC from the dissolved nitrogen. To further increase the electrical conductivity of the SiC and the SiC—$Si_3N_4$ bonded $C_3N_4$ compact, the dopants boron, phosphorus, and lithium can be used. For convenience, cost, and safety, boron doped silicon metal and phosphorus doped silicon metal are preferred. The use of the titanium metal to wet the $C_3N_4$ grains or particles also improves the electrical conductivity of the SiC and the $Si_3N_4$.

Example 7. Compact of Sintered sp3 Bonded $C_3N_4$ with Porosity

A sintered polycrystalline compact comprising sp3 bonded $C_3N_4$ is treated to remove the catalyst solvent to form a porous body. For a sintered polycrystalline compact comprising sp3 bonded $C_3N_4$ made with the $Fe_3Sn(C,N)$ catalyst solvent, the compact is deposited into a beaker of concentrated aqua regia with an addition of 10% HF (hydrofluoric) acid. The beaker with the acid solution and sintered compact is heated to above 90° C. but below the boiling temperature and is gently agitated to assist the removal of the dissolved elements from the pores. The beaker with acid solution and sintered compact is treated with acid at 90° C. for two weeks to remove the catalyst solvent, at which time it is cooled down. The porous sintered compact is recovered, acid in the pores neutralized, and the compact cleaned. A sintered polycrystalline compact comprising sp3 bonded $C_3N_4$ made with a mixture of solvent catalysts, $Ca_3SnN$ and $Ni_3MgC$, will be more reactive with the concentrated aqua regia mixture and would not require the addition of HF acid.

A sintered polycrystalline compact comprising sp3 bonded $C_3N_4$ bonded to a Co—WC cemented carbide substrate is treated to remove the catalyst solvent by electrochemical means to form a porous body. An electrical contact is made with the Co—WC substrate and the table of sp3 bonded $C_3N_4$ put into contact with an aqueous HCl solution. The Co—WC substrate is protected from contact with the acidic aqueous solution by using acid resistant o-rings and plastic collars. With the table of sp3 bonded $C_3N_4$ in contact with the acidic solution, an electric current is passed through the Co—WC substrate and into the table of sp3 bonded $C_3N_4$ through the acidic aqueous solution to an acid resistant electrode within the beaker. The voltage is maintained below the threshold of gaseous evolution to minimize danger from hydrogen gas evolution and to maximize the removal of the catalyst solvent from the pores of the table of sp3 bonded $C_3N_4$.

The disclosure above encompasses multiple distinct inventions with independent utility. While each of these inventions has been disclosed in a particular form, the specific embodiments disclosed and illustrated above are not to be considered in a limiting sense as numerous variations are possible. The subject matter of the inventions includes all novel and non-obvious combinations and subcombinations of the various elements, features, functions and/or properties disclosed above and inherent to those skilled in the art pertaining to such inventions. Where the disclosure or subsequently filed claims recite "a" element, "a first" element, or any such equivalent term, the disclosure or claims should be understood to incorporate one or more such elements, neither requiring nor excluding two or more such elements.

Applicant(s) reserves the right to submit claims directed to combinations and subcombinations of the disclosed inventions that are believed to be novel and non-obvious. Inventions embodied in other combinations and subcombinations of features, functions, elements and/or properties may be claimed through amendment of those claims or presentation of new claims in the present application or in a related application. Such amended or new claims, whether they are directed to the same invention or a different invention and whether they are different, broader, narrower or equal in scope to the original claims, are to be considered within the subject matter of the inventions described herein.

The invention claimed is:

1. A method of producing an sp3 bonded $C_3N_4$ product, the method comprising:
   contacting a starting material with a catalyst solvent in a reaction vessel;
   wherein the starting material comprises sp2 bonded $C_3N_4$;
   wherein the catalyst solvent is solid at room temperature;
   heating the reaction vessel to a temperature of 900° to 2000° C. under a pressure of 4 to 8 GPa;
   melting at least some of the catalyst solvent;
   transforming at least some of the sp2 bonded $C_3N_4$ into sp3 hybridized $C_3Na_4$
   wherein the catalyst solvent is a carbo-nitride based catalyst solvent comprising:
      a first compound, the first compound having the chemical formula AxByNz
         wherein A is selected from the group consisting of the transition metals, lanthanide metals and Ca;
         wherein B is selected from the group consisting of the Group IIIB metalloid elements, the Group IVB metalloid elements, Mg, Zn, and Cd;
         wherein N is nitrogen;
         wherein x is from 2.5 to 3.5;
         wherein y is from 0.5 to 1.5;
         wherein z is from 0.5 to 1.5; and
      a second compound, the second compound having the chemical formula DqErCs
         wherein D is selected from the group consisting of the transition metals, lanthanide metals and Ca;
         wherein E is selected from the group consisting of the Group IIIB metalloid elements, the Group IVB metalloid elements, Mg, Zn, and Cd;
         wherein C is carbon;

wherein q is from 2.5 to 3.5;
wherein r is from 0.5 to 1.5;
wherein s is from 0.5 to 1.5;
wherein the stoichiometric ratio of the number of moles of carbon of the second compound to the number of moles of nitrogen of the first compound in the catalyst solvent is from 2.5:4 to 3.9:4.

2. The method of claim 1, wherein x is 3, y is 1 and z is 1.

3. The method of claim 1, wherein q is 3, r is 1 and s is 1.

4. The method of claim 1, further comprising seeding the reaction vessel with particles of a crystal seed material.

5. The method of claim 4, wherein the crystal seed material comprises diamond.

6. The method of claim 4, wherein the crystal seed material comprises sp3 bonded $C_3N_4$.

7. The method of claim 4, further comprising growing a first single crystal via deposition of sp3 bonded C3N4 onto the surface of a single particle of crystal seed material.

8. The method of claim 1, wherein the catalyst solvent is a first catalyst solvent, the method further comprising incorporating at least some of the sp3 bonded $C_3N_4$ into a sintered polycrystalline compact via a second catalyst solvent.

9. The method of claim 8, further comprising creating pores in the sintered polycrystalline compact by removing the majority of the second catalyst solvent from the sintered polycrystalline compact.

10. The method of claim 9, wherein the second catalyst solvent comprises $Co_3SnC$ and $Co_3SnN$.

11. The method of claim 10, further comprising prior to the bonding step, creating a gradient layer on the surface of the substrate.

12. The method of claim 1, wherein the reaction vessel is a first reaction vessel, the method further comprising:
processing at least some of the sp3 bonded $C_3N_4$ into a powder;
loading the powder into a second reaction vessel;
arranging a layer of solid material comprising a second catalyst solvent n the second reaction vessel;
heating the second reaction vessel to a temperature of 900 to 2000 degrees C. under a pressure of 4 to 8 GPa;
melting at least some of the second catalyst solvent;
infiltrating the powdered sp3 bonded $C_3N_4$ with the melted catalyst solvent; and
cooling the second reaction vessel to produce a sintered polycrystalline compact comprising sp3 bonded $C_3N_4$.

13. The method of claim 8, further comprising bonding the sintered polycrystalline compact to a substrate via a binder phase, wherein the bonding occurs at a temperature of 900 to 2000 degrees C. under a pressure of 4 to 8 GPa.

14. The method of claim 13, wherein the binder phase has a melting temperature and wherein the second catalyst solvent has a inching temperature below the melting temperature of the binder phase.

15. The method of claim 13, further comprising prior to the bonding step, creating a roughened texture on the surface of the substrate.

16. The method of claim 1, rein the reaction vessel is a first reaction vessel, the method further comprising:
processing at least some of the sp3 bonded $C_3N_4$ into a powder;
mixing the powder with a second catalyst solvent to create a solid mixture;
wherein the catalyst solvent is solid at room temperature;
loading the mixture into a second reaction vessel;
heating the second reaction vessel to a temperature of 900 to 2000 degrees C. under a pressure of 4 to 8 GPa;
melting at least some of the second catalyst solvent; and
cooling the second reaction vessel to produce a sintered polycrystalline compact comprising sp3 bonded $C_3N_4$.

17. A method of producing an sp3 bonded C3N4 product, the method comprising:
contacting a starting material h a catalyst solvent in a reaction vessel;
wherein the starting material comprises sp2 bonded C3N4;
wherein the catalyst solvent is solid at room temperature;
heating the reaction vessel to a temperature of 900° to 2000° C. under a pressure of 4 to 8 GPa;
melting at least some of the catalyst solvent; and
transforming at least some of the sp2 bonded C3N4 into sp3 hybridized C3N4;
wherein the catalyst solvent is a metal alloy based catalyst solvent comprising a compound, having the chemical formula $G_xH_y$;
wherein G is selected from the group consisting of the transition metals, lanthanide metals and Ca;
wherein H is selected from the group consisting of the Group IIIB metalloid elements, the Group IVB metalloid elements, Mg, Zn, and Cd.

18. The method of claim 17, wherein a is from 2.5 to 3.5 and y is from 0.5 to 1.5.

19. A method of producing sp3 bonded C3N4 product, the method comprising:
contacting a starting material with a catalyst solvent ire a reaction vessel;
wherein the starting material comprises sp2 bonded C3N4;
wherein the catalyst solvent is solid at room temperature;
heating the reaction vessel to a temperature of 900° to 2000° C. under a pressure of 4 to 8 GPa;
melting at least some of the catalyst solvent;
transforming at least some of the sp2 bonded C3N4 into sp3 hybridized C3N4; and
seeding the reaction vessel with particles of a crystal seed material comprising diamond.

* * * * *